(12) United States Patent
Saini et al.

(10) Patent No.: US 7,158,291 B2
(45) Date of Patent: Jan. 2, 2007

(54) LOW POLARIZATION GAIN DEPENDENT SEMICONDUCTOR OPTICAL AMPLIFIER WITH VARIABLE RESIDUAL CLADDING LAYER THICKNESS

(75) Inventors: Simarjeet S. Saini, Columbia, MD (US); Peter J. S. Heim, Washington, DC (US); Scott A. Merritt, McLean, VA (US); Mario Dagenais, Chevy Chase, MD (US)

(73) Assignee: Quantum Photonics, Inc., Jessup, MD (US)

( * ) Notice: Subject to any disclaimer, the term of this patent is extended or adjusted under 35 U.S.C. 154(b) by 149 days.

(21) Appl. No.: 10/767,651

(22) Filed: Jan. 29, 2004

(65) Prior Publication Data

US 2005/0030614 A1    Feb. 10, 2005

Related U.S. Application Data

(60) Provisional application No. 60/443,534, filed on Jan. 30, 2003.

(51) Int. Cl.
*H01S 4/00* (2006.01)
*H04B 10/12* (2006.01)

(52) U.S. Cl. ...................................... 359/344
(58) Field of Classification Search ................. 359/344
See application file for complete search history.

(56) References Cited

U.S. PATENT DOCUMENTS

| 4,923,291 | A * | 5/1990 | Edagawa et al. ........... 359/334 |
| 5,982,531 | A | 11/1999 | Emery et al. |
| 6,310,720 | B1 | 10/2001 | Walker et al. |
| 6,310,995 | B1 | 10/2001 | Saini et al. |
| 2001/0043390 | A1 * | 11/2001 | Kim et al. .................. 359/344 |
| 2002/0067541 | A1 * | 6/2002 | Morito ....................... 359/344 |
| 2002/0154391 | A1 * | 10/2002 | Goldstein et al. ........... 359/344 |
| 2003/0067678 | A1 * | 4/2003 | Shibata et al. .............. 359/344 |

OTHER PUBLICATIONS

Shimada, S., et al., "Optical Amplifiers and their Applications," Semiconductor Laser Amplifiers, John Wiley & Sons, Chapter 4, 1994, pp. 70-72.

Koga, M., et al., "Polarization Insensitive Optical Amplifier Consisting of Two Semiconductor Laser Amplifiers and a Polarization Insensitive Isolator in Series," IEEE Photonics Technology Letters, vol. 1, No. 12, Dec. 1989, pp. 431-433.

Gustavsson, M., "Analysis of Polarization Independent Optical Amplifiers and Filters Based on Polarization Rotation in Periodically Asymmetric Waveguides," IEEE Journal of Quantum Electronics, vol. 29, No. 4, Apr. 1993, pp. 1168-1178.

* cited by examiner

*Primary Examiner*—Jack Keith
*Assistant Examiner*—Eric Bolda
(74) *Attorney, Agent, or Firm*—Potomac Patent Group PLLC

(57) ABSTRACT

A semiconductor optical amplifier (SOA) has an overall gain that is substantially polarization independent, i.e., less than 1 dB difference between transverse electric (TE) and transverse magnetic (TM) gain. The SOA includes a residual cladding layer having different thicknesses over different portions of the gain section. Over a first portion of the gain section, the residual cladding layer is thinner than over a second portion of the gain section. This results in the first portion providing more gain to optical energy having a TE polarization state than optical energy having a TM polarization state. In the second portion of the gain section, however, more gain is provided to optical energy having a TM polarization state than energy having a TE polarization state. The resulting gain differences can be designed to offset one another so that the output has a gain that is substantially polarization independent.

29 Claims, 7 Drawing Sheets

LOW POLARIZATION GAIN DEPENDENT SEMICONDUCTOR OPTICAL AMPLIFIER WITH VARIABLE RESIDUAL CLADDING LAYER THICKNESS

RELATED APPLICATIONS

This application is also related to, and claims priority from, U.S. Provisional Patent Application Ser. No. 60/443,534, filed on Jan. 30, 2003, entitled "A LOW POLARIZATION GAIN DEPENDENT SEMICONDUCTOR OPTICAL AMPLIFIER WITH VARIABLE RESIDUAL CLADDING LAYER THICKNESS", the disclosure of which is incorporated here by reference.

BACKGROUND

The present invention relates generally to semiconductor optical amplifiers and, more particularly, to ridge-waveguide type semiconductor optical amplifiers having low polarization gain dependency and methods of making such devices.

Technologies associated with the communication of information have evolved rapidly over the last several decades. Optical information communication technologies have evolved as the technology of choice for backbone information communication systems due to, among other things, their ability to provide large bandwidth, fast transmission speeds and high channel quality. Semiconductor lasers and optical amplifiers are used in many aspects of optical communication systems, for example to generate optical carriers in optical transceivers and to generate optically amplified signals in optical transmission systems. Among other things, optical amplifiers are used to compensate for the attenuation of optical data signals transmitted over long distances.

There are several different types of optical amplifiers being used in today's optical communication systems. In erbium-doped fiber amplifiers (EDFAs) and Raman amplifiers, the optical fiber itself acts as a gain medium that transfers energy from pump lasers to the optical data signal traveling therethrough. In semiconductor optical amplifiers (SOAs), an electrical current is used to pump the active region of a semiconductor device. The optical signal is input to the SOA from the optical fiber where it experiences gain due to stimulated emission as it passes through the active region of the SOA.

Like other devices employed in optical networks, SOAs suffer from polarization sensitivity. That is, the gain experienced by a light beam that is input to a conventional SOA will vary depending upon the polarization state of the input optical energy. In this context, the polarization state of a light beam is typically described by the orthogonal polarization components referred to as transverse electric (TE) and transverse magnetic (TM). Unfortunately even if light having a known (e.g., linear) polarization state is injected into a typical optical fiber (i.e., a single mode fiber) after propagation through the optical fiber the light will become elliptically polarized. This means that the light input to SOAs placed along the optical fiber will have TE and TM polarization components of unknown magnitude and phase, resulting in the gain applied by SOAs also varying indeterminately as a function of the polarization state of the input light.

There are various techniques that have been employed to compensate for the polarization dependent gain that is introduced by SOAs. One such technique, shown in FIG. 1, is to arrange two SOAs in series. In amplifier 10, the gain for TE mode light is greater than the gain for TM mode light. Amplifier 12 has the same structure as amplifier 10 but is rotated by 90 degrees so that the gain for TM mode light is greater than the gain for TE mode light, i.e., in reverse proportion to the polarization gain ratio for amplifier 10. In this way, the optical energy output from the combination of amplifiers 10 and 12 is substantially polarization independent. This technique can also be practiced by arranging the SOAs in parallel as described, for example, in the textbook *Optical Amplifiers and their Applications*, edited by S. Shimada and H. Ishio, published by John Wiley & Sons, Chapter 4, pp. 70–72, the disclosure of which is incorporated here by reference. A similar technique is described in the article entitled "Polarization Insensitive Optical Amplifier Consisting of Two Semiconductor Laser Amplifiers and a Polarization Insensitive Isolator in Series", by Koga et al., IEEE Photonics Technology Letters, Vol. 1, No. 12, December 1989, pp. 431–33, the disclosure of which is incorporated here by reference. Therein, two SOAs are separated by a polarization insensitive isolator. Another technique for compensating for polarization dependent gain is to use some other corrective device downstream of the SOA as shown in FIG. 2. For example, a variable polarization dependent loss control device 22 can be disposed downstream of the SOA 20 to compensate for unequal magnitudes of TE and TM gain. This technique is described in U.S. Pat. No. 6,310,720, the disclosure of which is incorporated here by reference. All of these techniques suffer from, among other things, the drawback of requiring a number of additional components to create a single polarization insensitive SOA, and the lack of integration of the components, thereby increasing the cost of the solutions. For example, the technique described in the Koga article employs a polarization insensitive optical isolator that is not amenable to monolithic integration with the two SOAs.

Attempts have also been made to provide an integrated solution to this problem, i.e., to design polarization insensitive SOAs. One such attempt is described in the article entitled "Analysis of Polarization Independent Optical Amplifiers and Filters Based on Polarization Rotation in Periodically Asymmetric Waveguides", by Mats Gustavsson, IEEE Journal of Quantum Electronics, Vol. 29, No. 4, April 1993, pp1168–1178, the disclosure of which is incorporated herein by reference. Therein, a periodically asymmetric active waveguide is used to fabricate a polarization insensitive laser amplifier. However, as seen in FIG. 2 of this article, this device is only able to provide polarization insensitivity at one particular operating gain level. At other operating levels, the device is actually quite polarization sensitive. Another attempt at an integrated solution is found in U.S. Pat. No. 5,982,531 to Emery et al., the disclosure of which is incorporated here by reference. Therein, the active material in the SOA is subjected to a tensile strain sufficient to render the amplifier insensitive to the polarization of the light to be amplified. However, balancing the TE/TM gain using such techniques requires extremely accurate control over device geometry, layer thickness, layer composition and background absorption loss. In practice, this level of control is very difficult to achieve in a repeatable manufacturing process, i.e., there may be a significant variance in the polarization sensitivity of SOAs manufactured using such techniques from one manufacturing run to another.

Accordingly, Applicants would like to provide techniques and devices that provide monolithically integrated, polarization insensitive SOAs in a manner which is cost effective and facilitates manufacturing repeatability.

SUMMARY

Systems and methods according to the present invention address this need and others by providing polarization insensitive semiconductor optical amplifiers. According to exemplary embodiments of the present invention, semiconductor optical amplifiers have an overall gain (i.e., from device input to device output) that is substantially independent of the polarization state of the input, i.e., less than 1 dB difference between transverse electric (TE) and transverse magnetic (TM) overall gain. This is accomplished even though portions of the active region of the SOA can have substantial (i.e. greater than 1 dB) polarization gain dependence. SOAs according to the present invention include a portion of the active region in which TE gain is enhanced and a portion of the active region in which TM gain is enhanced by, for example, varying an etch depth of the residual cladding layer thickness above each portion. For example, over a first portion of the gain section, the residual cladding layer is thinner than over a second portion of the gain section. This results in the first portion providing more gain to optical energy having a TE polarization state than optical energy having a TM polarization state. In the second portion of the gain section, however, more gain is provided to optical energy having a TM polarization state than energy having a TE polarization state. The resulting gain differences can be designed to offset one another so that the output has a gain that is substantially polarization independent.

According to one exemplary embodiment of the present invention, a semiconductor optical amplifier includes a substrate, a first gain section, disposed on the substrate, and a second gain section, disposed on the substrate and adjacent to the first gain section; a residual cladding layer disposed above the first pain section and the second pain section, wherein the residual cladding layer has a first thickness over the first gain section, and a second thickness over the second gain section, the first thickness being different than the second thickness, wherein the first thickness of the residual cladding layer is selected to cause transverse electric (TE) light passing through the first gain section to experience a greater gain than transverse magnetic (TM) light passing through the first gain section: and wherein the second thickness of the residual cladding layer is selected to cause the TM light passing through the second gain section to experience a greater gain than the TE light passing through the second gain section.

According to another exemplary embodiment of the present invention, a semiconductor optical amplifier includes a substrate, a gain section, provided on the substrate, for providing gain to an input optical signal; and a residual cladding layer provided on the gain section, the residual cladding layer having a first thickness over a first portion of the gain section and a second thickness over a second portion of the gain section, the first thickness being different than the second thickness.

According to another exemplary embodiment of the present invention, a method for amplifying an optical signal includes the steps of: providing a gain section on a substrate; providing, on a first portion of the gain section, a residual cladding layer having a first thickness; providing, on a second portion of the gain section, a residual cladding layer having a second thickness, the first and second thicknesses being different from one another; amplifying the optical signal in the first portion of said gain section to generate an amplified optical signal having a transverse electric (TE) component which is greater than a transverse magnetic (TM) component; and amplifying the amplified optical signal in the second portion of the gain section to generate a substantially polarization independent output optical signal.

BRIEF DESCRIPTION OF THE DRAWINGS

The accompanying drawings illustrate exemplary embodiments of the present invention, wherein.

DETAILED DESCRIPTION

The following detailed description of the invention refers to the accompanying drawings. The same reference numbers in different drawings identify the same or similar elements. Also, the following detailed description does not limit the invention. Instead, the scope of the invention is defined by the appended claims.

Devices and methods according to exemplary embodiments of the present invention provide ridge-waveguide semiconductor optical amplifiers whose overall gain is substantially polarization independent, i.e., in the output of semiconductor optical amplifiers according to exemplary embodiments gain provided to input optical energy having a TE polarization is substantially equal to the gain provided to input optical energy having a TM polarization. In the context of the present invention, "substantially polarization independent" refers to a difference between TE and TM overall gain of less than 1dB and, preferably, less than 0.5 dB. This quality of SOAs according to the present invention is achieved by, for example, providing an SOA having at least two different sections, a first section in which TE gain is greater than TM gain and a second section in which TM gain is greater than TE gain. By design, the two sections TEITM gain differences will offset one another, such that the overall gain is substantially polarization independent. According to exemplary embodiments of the present invention, this can be accomplished by varying the thickness (etch depth) of the residual cladding layer of the SOA.

Figure 1:
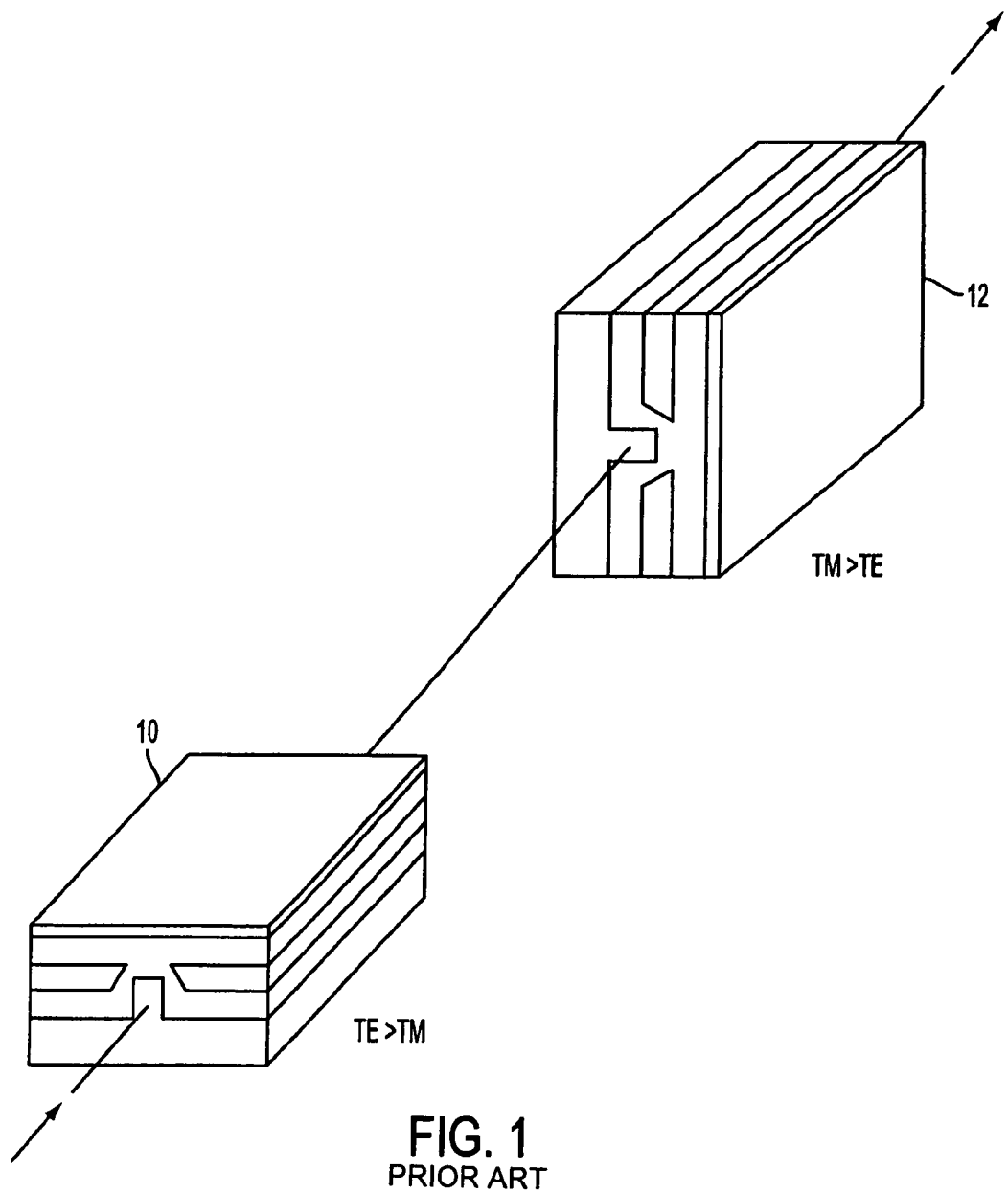
FIG. 1 depicts a conventional technique for compensating for polarization dependent gain of SOAs by employing two SOAs in series.
Figure 2:
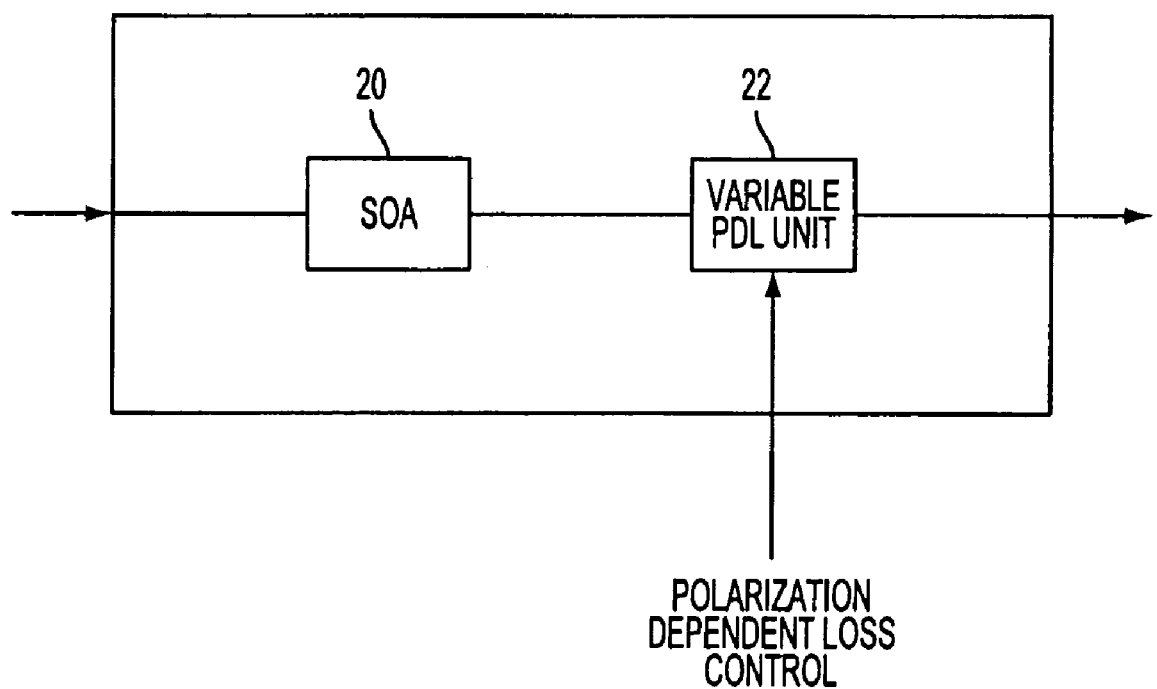
FIG. 2 depicts another conventional technique involving employing a downstream corrective device that adjusts the gain.
Figure 3:
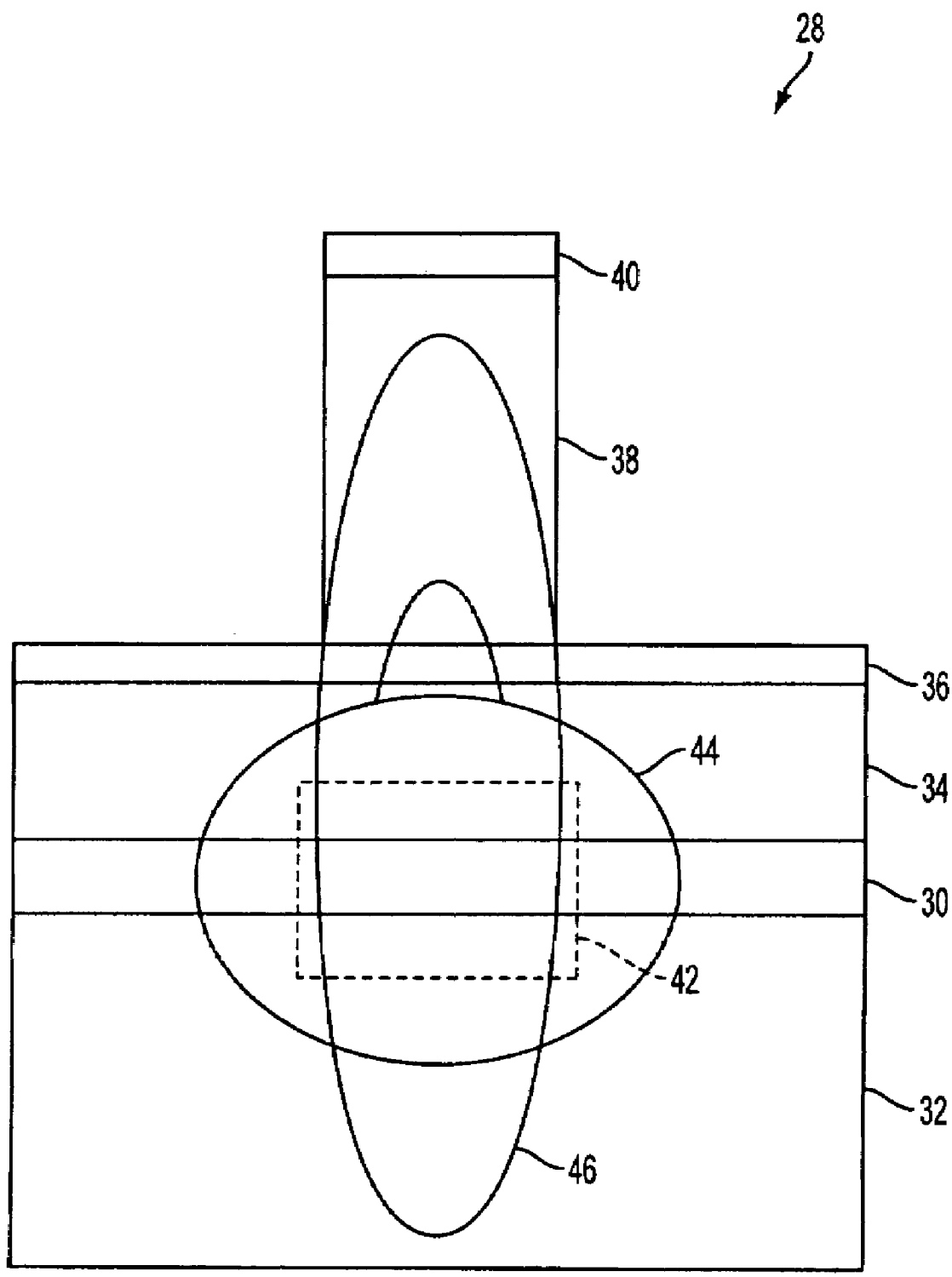
FIG. 3 depicts a conventional, ridge-waveguide type SOA having a uniform residual cladding layer thickness.

Consider the exemplary, conventional ridge-waveguide-type SOA 28 structure illustrated in the cross-section of FIG. 3. Therein an active (gain) region 30 is sandwiched between the substrate layer 32 and the residual cladding layer 34. Those skilled in the art will appreciate that any gain structure can be employed as active region 30, e.g., a buried-type device and/or bulk materials can be used to fabricate gain section 30. Multiple quantum wells (not shown) may be provided in gain section 30 using various materials, e.g., InAlGaAs, InGaAsP and InP, to create gain section 30 using well known techniques. The substrate layer 32 and residual cladding layer 34 can be formed from, for example, InP. An etch stop layer 36 is disposed on top of the residual cladding layer 34. The ridge is formed from another InP layer 38 capped by a metal electrode 40. Current is injected via electrode 40 into the SOA 28, so that gain is applied to an optical signal passing through the active region 30. However, gain is only applied in the pumped region 42 of the active region 30. Outside of the pumped region 42, where there is no pumping current, the optical signal suffers from energy absorption as it passes through the SOA 28. The input optical power $P_{in}$ injected into the SOA 28 is amplified according to $P_{out}=G_{sp}P_{in}$, where $G_{sp}$ is the single pass gain over the length L of the SOA 28 such that $G_{sp}=e^{g_{net}L}$. The net $g_{net}$ is given by $g_{net}=\Gamma g-\alpha$ where $\Gamma$, g, and $\alpha$ are the optical confinement factor, the material gain and the optical loss, respectively. The optical loss can be further expressed as the sum of fixed and variable components: $\alpha=\Gamma_{up}\alpha_{up}-\alpha_{bg}$ where $\Gamma_{up}$, $\alpha_{up}$, and $\alpha_{bg}$ are the optical loss confinement factor, optical loss in the unpumped region, and fixed background optical loss, respectively. The optical loss increases as the amount of optical energy overlapping the unpumped region ($\Gamma_{up}$) increases.

The beam shape and/or size of the optical signal as it passes through SOA 28 is typically referred to as the "mode". The mode of an optical signal changes based upon its polarization state as shown in FIG. 3. This results in the TE mode 44 extending further outside of the pumped region 42 than the TM mode 46.

Figure 4A:
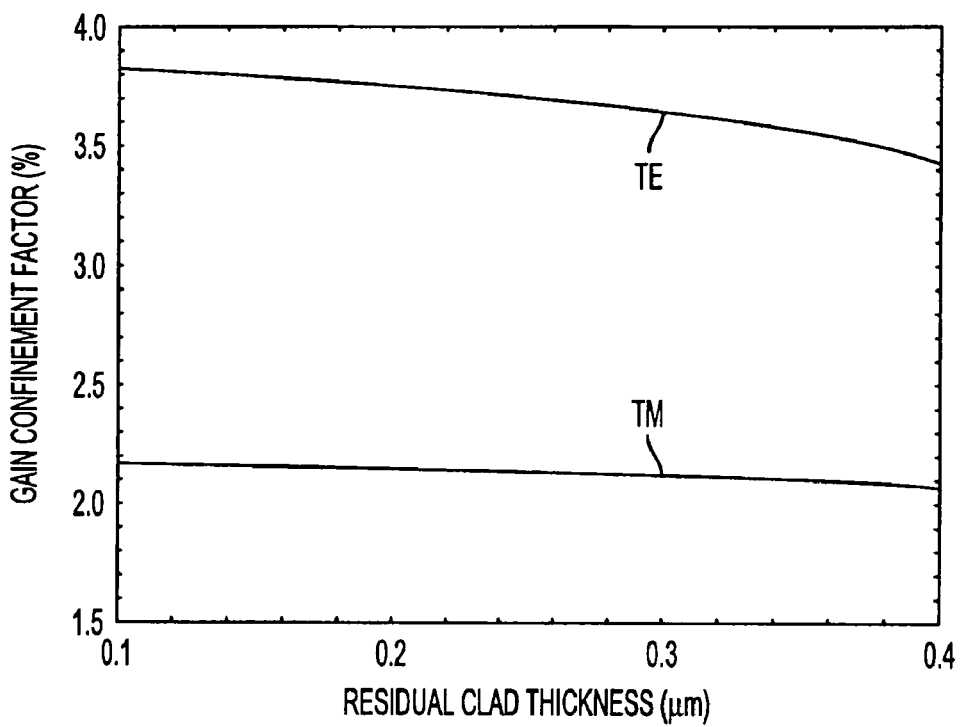
FIGS. 4(a) and 4(b) are graphs depicting the effect of varying the residual cladding layer on the gain confinement factor and loss confinement factor, respectively, in an exemplary SOA for optical energy having TE and TM polarization states.
Figure 4B:
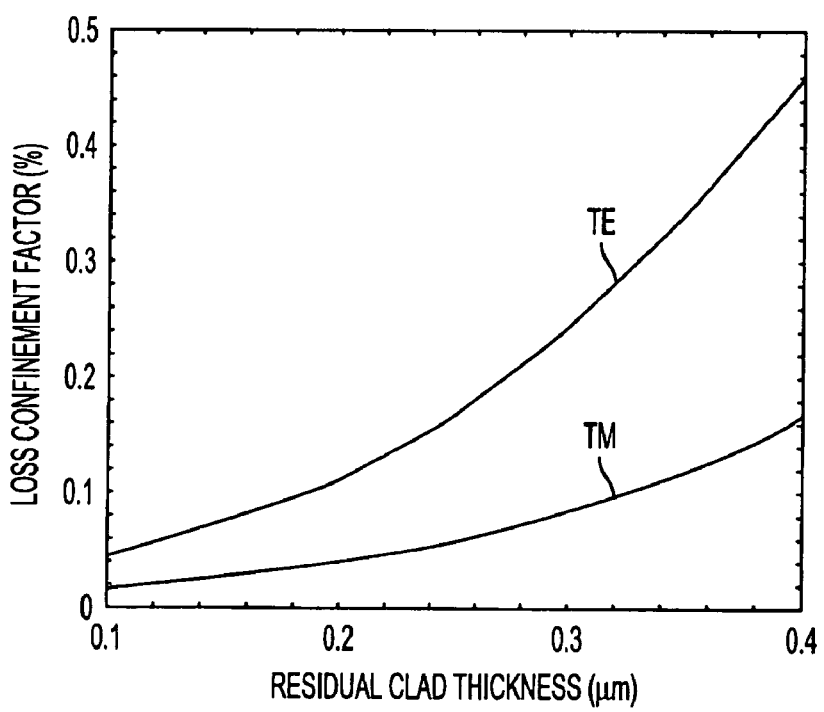

Applicants have discovered that by changing the thickness of the residual cladding layer 34, the gain received by both the TM mode energy and the TE mode energy changes. Moreover, the change in TM mode energy gain and the change in TE mode energy gain are different as a function of residual cladding layer thickness. Consider the graphs of FIGS. 4(*a*) and 4(*b*), which reflect Applicants' testing of devices having different residual cladding thicknesses. In FIG. 4(*a*), the gain confinement factors are plotted versus residual cladding thickness for both TE mode energy (upper line) and TM mode energy (lower line). This graph shows that as the residual cladding layer thickness increases, the gain confinement factors for both TE mode energy and TM mode energy decrease, but that the gain confinement factor for TE mode energy decreases more rapidly than the gain confinement factor for TM mode energy as a function of increasing residual cladding layer thickness. Similarly, the loss confinement factor (FIG. 4(*b*)) increases for both TE mode energy and TM mode energy with increasing residual cladding layer thickness, however the rate of increase is less for TM mode energy than it is for TE mode energy. This data confirms that as the residual cladding thickness increases, the gain applied to the TE mode energy drops off faster than the gain applied to the TM mode energy. This property can be applied, according to exemplary embodiments of the present invention, to fabricate SOAs that are substantially polarization independent.

Figure 5:
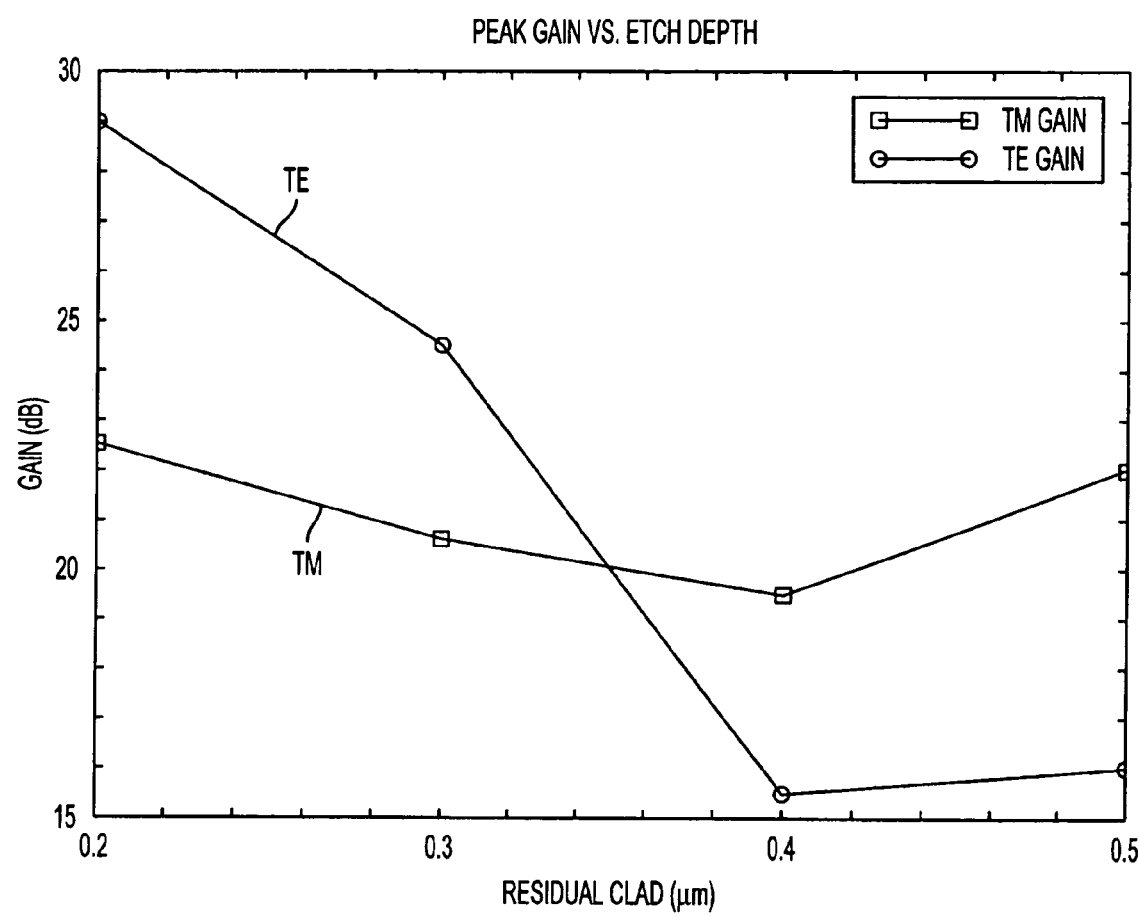
FIG. 5 is a graph depicting gain as a function of residual cladding layer thickness for both optical energy having a TE polarization state and a TM polarization state.

Initially, Applicants tested a number of SOAs having different residual cladding thicknesses in order to quantify the differences in TE mode gain vs. TM mode gain. Exemplary results are plotted in the graph of FIG. 5. Therein, it can be seen that the TE mode gain is significantly higher than the TM mode gain for residual cladding layer thicknesses of less than 0.3 micrometers, but falls off more quickly than the TM mode gain such that the gains are approximately equal at about a residual cladding depth of 0.35 micrometers (referred to below as the "crossover gain point"). Then, for residual cladding thicknesses of more than about 0.35 micrometers, the TM mode gain is greater than the TE mode gain. Those skilled in the art will appreciate that devices employing different materials, fabrication processes, etc. may have different crossover gain points and TE/TM gain characteristics than the example provided in FIG. 5.

Figure 6A:
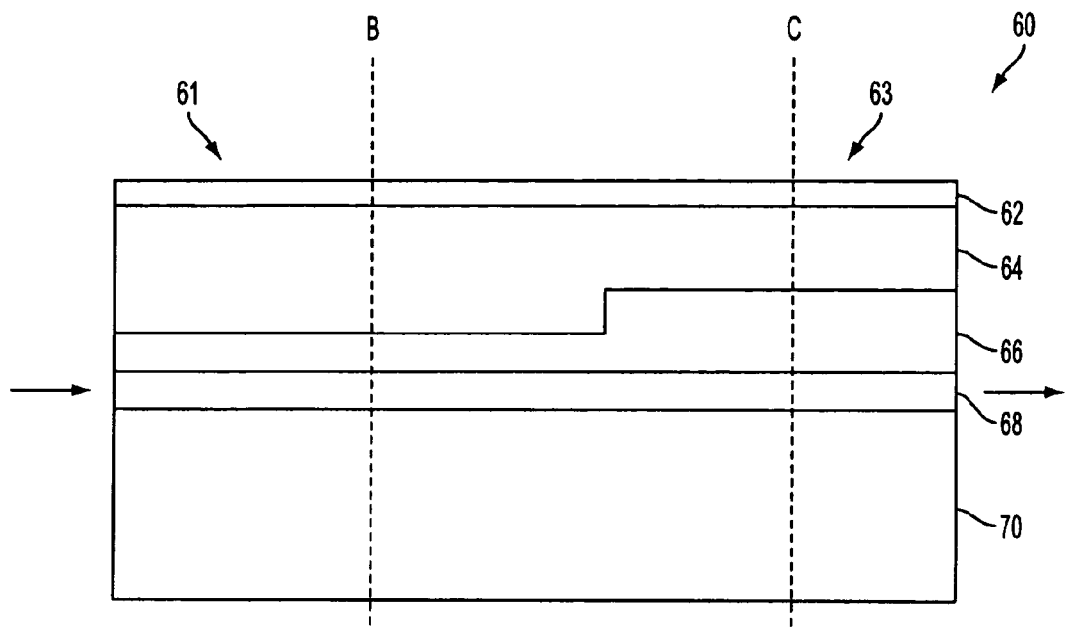
FIGS. 6(a)–6(c) depict an SOA according to an exemplary embodiment of the present invention having a residual cladding layer with a first thickness over a first portion of a gain section and a second thickness over a second portion of the gain section.
Figure 6B:
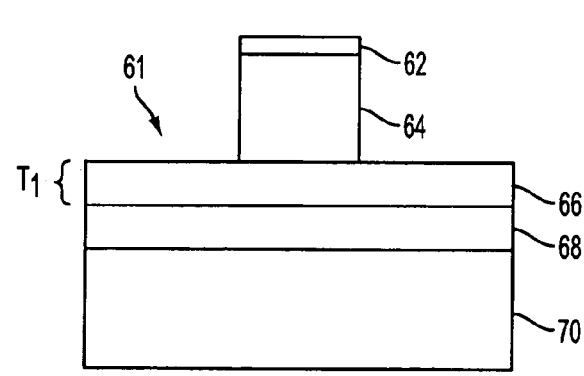
Figure 6C:
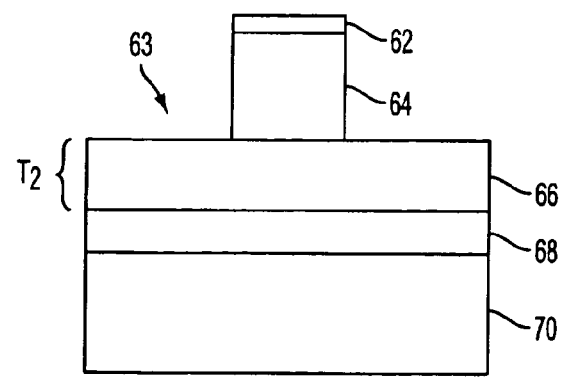

Using this type of data, a substantially polarization independent SOA 60 can be fabricated from two sections as shown in FIG. 6(*a*). In this side view of an SOA according to an exemplary embodiment of the present invention, a first section 61 has a TE gain which is greater than its TM gain and a second section 63 has a TM gain which is greater than its TE gain. FIGS. 6(*b*) and 6(*c*) are cross-sectional views of SOA 60 taken across section lines B and C, respectively, in FIG. 6(*a*). In FIGS. 6(*a*)–(*c*), from top to bottom, the SOA 60 includes a metallization layer 62, an InP layer constituting the ridge 64, a residual cladding layer 66, an active (gain) region 68 and a substrate 70. By selecting a first residual cladding thickness $T_1$ for the first section 61, i.e., wherein the first thickness is less than the crossover gain point, and a second residual cladding thickness $T_2$ for the second section 63, i.e., wherein the second thickness is greater than the crossover gain point, the polarization gain differences will offset one another. Returning to FIG. 5, it can be seen that, for example, selecting a first residual cladding layer thickness $T_1$ of about 0.3 micrometers will provide the first section 61 of the SOA 60 with approximately a 4 dB difference between TE gain and TM gain, with TE gain>TM gain. Then by selecting a second residual cladding layer thickness $T_2$ of about 0.4 micrometers, the second section 63 will also have approximately a 4 dB difference between TE and TM gain, but with TM gain>TE gain. Those skilled in the art will appreciate that, for different implementations, these respective residual cladding layer thicknesses can be less than 0.3 micrometers and more than 0.4 micrometers, respectively.

Figure 7:
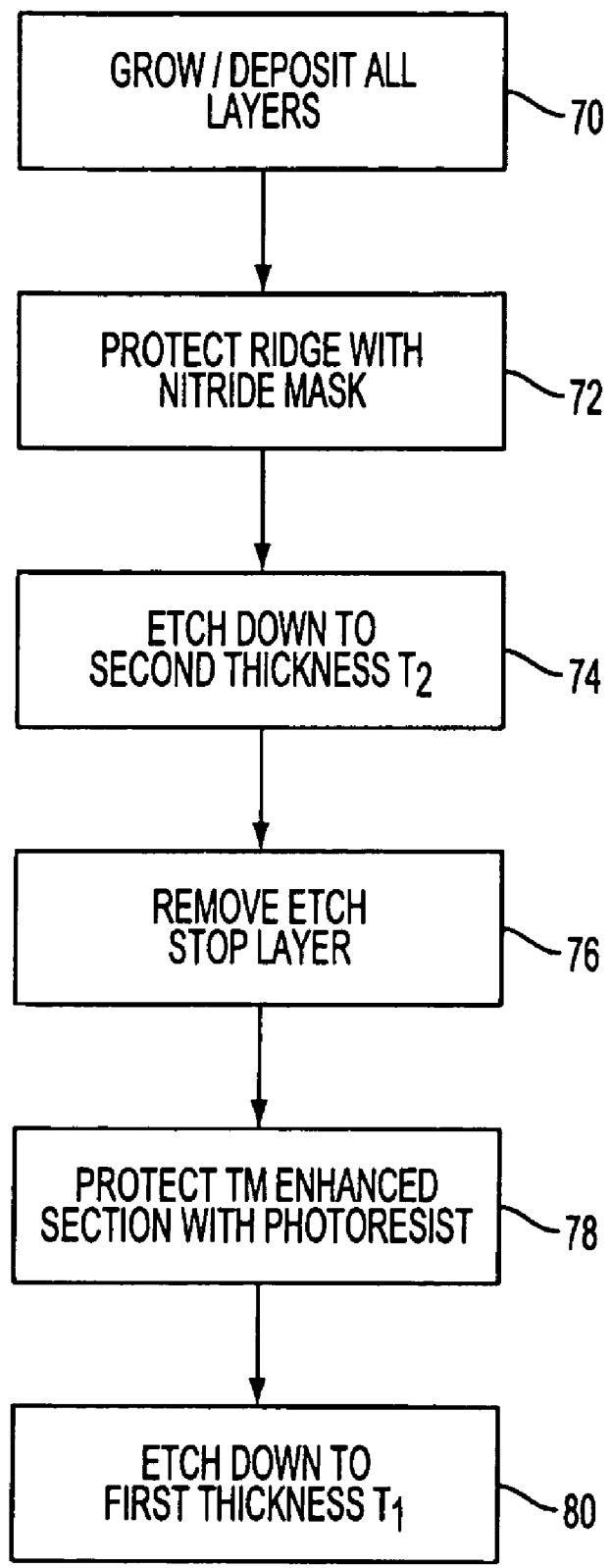
FIG. 7 is a flowchart depicting a method for fabricating an SOA according to an exemplary embodiment of the present invention.

A method for fabricating SOAs according to an exemplary embodiment of the present invention is depicted in the flowchart of FIG. 7. Initially, at step 70, the structure is grown or deposited using conventional semiconductor fabrication techniques, with the exception that two etch stop layers are provided above the active region, i.e., one for each of the two thicknesses of the residual cladding layer. Once the structure is grown or deposited, the ridge portion of the device is protected using, for example, a nitride mask at step 72. Then, at step 74, the portions of the SOA on either side of the ridge are etched down to the first etch stop layer, i.e., such that the residual cladding layer then has a thickness $T_2$. The first etch stop layer is then removed (step 76) and the portion of the residual cladding layer within the second section (TM enhanced) is protected by, for example, application of a photoresist layer at step 78. Then, the first section's residual cladding layer can be further etched so that its thickness becomes $T_1$ at step 80.

Applicants' initial testing indicates that reflections at the etch boundary, i.e., between the first section 61 and second section 63, are not a significant concern. If, however, various implementations of the present invention result in significant reflection of optical signal energy at the etch boundary, then one of the sections can be positioned at an angle relative to the other to reduce reflections. Alternatively, the active waveguide in the first section 61 can be connected to the second section 63 using an integration technique, for example, employing a resonantly coupled set of active and passive waveguides. More details regarding this type of integration technique using resonantly coupled devices per se can be found in U.S. Pat. No. 6,310,995 (the "'995 patent"), the disclosure of which is incorporated here by reference.

The above-described exemplary embodiments are intended to be illustrative in all respects, rather than restrictive, of the present invention. Thus the present invention is capable of many variations in detailed implementation that can be derived from the description contained herein by a person skilled in the art. All such variations and modifications are considered to be within the scope and spirit of the present invention as defined by the following claims. No element, act, or instruction used in the description of the present application should be construed as critical or essential to the invention unless explicitly described as such. Also, as used herein, the article "a" is intended to include one or more items.

What is claimed is:

1. A semiconductor optical amplifier comprising:
   a substrate;
   a first gain section, disposed on said substrate;
   a second gain section, disposed on said substrate and adjacent to said first gain section;
   a residual cladding layer disposed above said first gain section and said second gain section,
   wherein said residual cladding layer has a first thickness over said first gain section, and a second thickness over said second gain section, said first thickness being different than said second thickness,
   wherein said first thickness of said residual cladding layer is selected to cause transverse electric (TE) light passing through said first gain section to experience a greater gain than transverse magnetic (TM) light passing through said first gain section; and
   wherein said second thickness of said residual cladding layer is selected to cause said TM light passing through said second gain section to experience a greater gain than said TE light passing through said second gain section.

2. The semiconductor optical amplifier of claim 1, wherein said first and second gain sections are fabricated using one of quantum well materials and bulk materials.

3. The semiconductor optical amplifier of claim 1, wherein said first and second gain sections receive substantially the same drive current and have substantially the same length.

4. The semiconductor optical amplifier of claim 1, wherein said first thickness is less than said second thickness.

5. The semiconductor optical amplifier of claim 4, wherein said first thickness is 0.3 micrometers or more and said second thickness is 0.4 micrometers or less.

6. The semiconductor amplifier of claim 1, wherein a boundary between said first gain section and said second gain section is positioned to reduce reflections at the interface.

7. The semiconductor amplifier of claim 1, wherein the first gain section and the second gain section are connected by a passive waveguide.

8. The semiconductor amplifier of claim 7, wherein a mode transformation from active waveguides in the first and second gain sections to a passive waveguide connecting the first and second gain section employs a resonantly coupled set of active and passive waveguides.

9. The semiconductor optical amplifier of claim 1, wherein an overall gain of said semiconductor optical amplifier is substantially polarization independent.

10. A semiconductor optical amplifier comprising:
    substrate means for integrating elements of said semiconductor optical amplifier thereon;
    first gain means, disposed on said substrate
    second gain means, disposed on said substrate and adjacent to said first gain means,
    residual cladding means for disposal above said first gain means and said second gain means,
    wherein said residual cladding means has a first thickness over said first gain means, and a second thickness over said second gain means, said first thickness being different than said second thickness,
    wherein said first thickness of said residual cladding means is selected to cause transverse electric (TE) light passing through said first gain means to experience a greater gain than transverse magnetic (TM) light passing through said first gain section; and
    wherein said second thickness of said residual cladding means is selected to cause said TM light passing through said second gains means to experience a greater gain than said TE light passing through said second gain section.

11. The semiconductor optical amplifier of claim 10, wherein said first and second gain means are fabricated using one of quantum well materials and bulk materials.

12. The semiconductor optical amplifier of claim 10, wherein said first and second gain means receive substantially the same drive current and have substantially the same length.

13. The semiconductor optical amplifier of claim 10, wherein said first thickness is less than said second thickness.

14. The semiconductor optical amplifier of claim 13, wherein said first thickness is 0.3 micrometers or less and said second thickness is 0.4 micrometers or more.

15. The semiconductor amplifier of claim 10, wherein the first gain section and the second gain section are connected by a passive waveguide.

16. The semiconductor amplifier of claim 15, wherein a mode transformation from active waveguides in the first and second gain sections to a passive waveguide connecting the first and second gain section employs a resonantly coupled set of active and passive waveguides.

17. The semiconductor optical amplifier of claim 10, wherein an overall gain of said semiconductor optical amplifier is substantially polarization independent.

18. A semiconductor optical amplifier comprising:
    a substrate;
    a gain section, provided on said substrate;
    a residual cladding layer disposed above said gain section,
    wherein said residual cladding layer has a first thickness over a first portion of said gain section and a second thickness over a second portion of said gain section, said first thickness being different than said second thickness,
    wherein said first thickness of said residual cladding layer is selected to cause transverse electric (TE) light passing through said first portion of said gain section to experience a greater gain than transverse magnetic (TM) light passing through said first gain section; and
    wherein said second thickness of said residual cladding layer is selected to cause said TM light passing through said second portion of said gain section to experience a greater gain than said TE light passing through said second portion of said gain section.

19. The semiconductor optical amplifier of claim 18, wherein said gain section is fabricated using one of quantum well materials and bulk materials.

20. The semiconductor optical amplifier of claim 18, wherein said first and second portions of said gain section receive substantially the same drive current and have substantially the same length.

21. The semiconductor optical amplifier of claim 18, wherein said first thickness is less than said second thickness.

22. The semiconductor optical amplifier of claim 21, wherein said first thickness is 0.3 micrometers or more and said second thickness is 0.4 micrometers or less.

23. The semiconductor amplifier of claim 18, wherein a boundary between said first portion of said gain section and said second portion of said gain section is positioned to reduce reflections at the interface.

24. The semiconductor amplifier of claim 18, wherein the first portion of said gain section and the second portion of said gain section are connected by a passive waveguide.

25. The semiconductor amplifier of claim 24, wherein a mode transformation from active waveguides in the first and second portions of said gain section to said passive waveguide connecting the first and second portions of said gain section employs a resonantly coupled set of active and passive waveguides.

26. The semiconductor optical amplifier of claim 18, wherein an overall gain of said semiconductor optical amplifier is substantially polarization independent.

27. A method for amplifying an optical signal comprising the steps of:
    providing a substrate;
    providing a first gain section disposed on said substrate;
    providing a second gain section disposed on said substrate and adjacent to said first gain section;
    providing a residual cladding layer disposed above said first gain section and said second gain section, wherein said residual cladding layer has a first thickness over said first gain section, and a second thickness over said second gain section, said first thickness being different than said second thickness,
    selecting said first thickness of said of said residual cladding layer to cause transverse electric (TE) light passing through said first gain section to experience a greater gain than transverse magnetic (TM) light passing through said first gain section;
    selecting said second thickness of said residual cladding layer to cause said TM light passing through said second gain section to experience a greater gain than said TE light passing through said second gain section;
    amplifying said optical signal in said first portion of said gain section to generate an amplified optical signal having a transverse electric (TE) component which is greater than a transverse magnetic (TM) component; and
    amplifying said amplified optical signal in said second portion of said gain section to generate a substantially polarization independent output optical signal.

28. The method of claim 27, further comprising the step of:
    fabricating said gain section using one of quantum well materials and bulk materials.

29. The method of claim 27, further comprising the step of:
    driving said first and second portions of said gain section with substantially the same drive current.

* * * * *